United States Patent [19]
Snyder et al.

[11] Patent Number: 5,213,851
[45] Date of Patent: May 25, 1993

[54] PROCESS FOR PREPARING FERRITE FILMS BY RADIO-FREQUENCY GENERATED AEROSOL PLASMA DEPOSITION IN ATMOSPHERE

[75] Inventors: Robert L. Snyder, Alfred, N.Y.; John Simmins, Frederick, Md.; Xingwu Wang, Alfred, N.Y.

[73] Assignee: Alfred University, Alfred, N.Y.

[21] Appl. No.: 866,665

[22] Filed: Apr. 8, 1992

Related U.S. Application Data

[63] Continuation-in-part of Ser. No. 510,011, Apr. 17, 1990, Pat. No. 5,120,703.

[51] Int. Cl.$^5$ .......................... B05D 3/06; B05D 5/12
[52] U.S. Cl. ...................... 427/576; 427/565; 427/569; 427/126.3; 427/126.6; 427/128; 427/600
[58] Field of Search .............. 427/38, 39, 57, 226, 427/128, 314, 126.3, 126.6, 421, 576, 565, 569, 600

[56] References Cited

U.S. PATENT DOCUMENTS

| | | | |
|---|---|---|---|
| 4,835,069 | 5/1989 | Sawada et al. | 428/694 |
| 4,837,046 | 6/1989 | Oishi et al. | 427/38 |
| 4,844,977 | 7/1989 | Nakamura et al. | 428/328 |
| 5,032,568 | 7/1991 | Lau et al. | 505/1 |

FOREIGN PATENT DOCUMENTS 64-27132  1/1989  Japan .

Primary Examiner—Shrive Beck
Assistant Examiner—Roy V. King
Attorney, Agent, or Firm—Howard J. Greenwald

[57] ABSTRACT

In accordance with this invention, there is provided an atmospheric process for the production of a ferritic coating or film. In the first step of this process, an aerosol mist containing reactants necessary to form the ferrite is provided. Thereafter, the mist is subjected to radio-frequency radiation while in the plasma region. Thereafter, the vaporized mixture is then deposited onto a substrate.

17 Claims, 1 Drawing Sheet

PROCESS FOR PREPARING FERRITE FILMS BY RADIO-FREQUENCY GENERATED AEROSOL PLASMA DEPOSITION IN ATMOSPHERE

CROSS-REFERENCE TO RELATED PATENT APPLICATION

This is a continuation-in-part of application 07/510,011, filed on Apr. 17, 1990, now U.S. Pat. No. 5,120,703.

FIELD OF THE INVENTION

An atmospheric process for preparing films of ferrite material by deposition of a plasma vapor upon a substrate.

BACKGROUND OF THE INVENTION

For the past fifty years, ferrimagnetic oxide ceramics (ferrites) have been prized for a range of properties that has no equivalent in the existing metal magnetic materials. These ferritic materials are discussed, e.g., in an article by Alex Goldman entitled "Magnetic Ceramics" which appears on pages 147–189 of Lionel M. Levinson's "Electronic Ceramics" (Marcel Dekker, Inc., New York, 1988).

At page 170 of the Goldman article, it is taught that ferritic materials may be used to produce permanent magnet materials, cores for high-frequency power supplies, cores for low-level indictors for telecommunications filters, deflection yokes for television, high-frequency transformers, recording heads for audio and digital magnetic recording, recording media, radar absorbing paint, sensors, microwave components, copier powders, electrodes, ferrofluids, and magnetostrictive transducers.

One of the more important applications for ferritic materials is in microwave technology, where these materials may be used to produce ferrite loaded rectangular waveguides, junction circulators, magnetically tunable microwave filters, microwave switches, and the like. See, e.g., J. Helszain's "Principles of Mircowave Ferrite Engineering"(Wiley-Interscience, New York, 1969).

Films of ferritic material, with thicknesses of from about 0.1 to about 500 microns, have been proposed for use in electronic circuits; see, for example, "Advances in Ceramics, Volume 16, Fourth International Conference on Ferrites, Part II," Edited by Franklin F. Y. Wang (The American Ceramic Society, Inc., Columbus, Ohio, 1984). These ferritic films are useful for microwave integrated circuits, mangetooptical devices, microinductance devices, and the like.

To the best of applicants' knowledge, an economical, reliable process for the large-scale production of high-quality ferritic films has not been described in the prior art. Thus, for example, on page 9 of Volume 15 of "Advances in Ceramics, Fourth International Conference on Ferrites, Part I," Edited by Franklin F. Y. Wang (The American Ceramic Society, Inc., Columbus, Ohio, 1984), it was disclosed that "Thin films of ferrite . . . have been produced experimentally . . . . but a manufacturing technology to produce a high-quality product has not been established."

In 1971, in U.S. Pat. No. 3,576,672, Douglas H. Harris and Richard J. Janowiecki described a process for depositing ferrite coatings by using a direct current arc plasma generator to heat powdered ferrites. Although this process was superior to prior art processes, it often produced ferrite coatings which were substantially inhomogeneous.

In 1989, in U.S. Pat. No. 4,816,292, Hamime Machida described a process for applying a ferrite coating upon a substrate in which a metal-ion solution is applied to the substrate and the ferrous ion therein is thereafter oxidized. The Machida process often requires the substrate used in it to be heated (see column 3) and, despite such heating, often produces a ferrite film layer with insufficient crystallization (see lines 67 et seq. of column 3), in which case the film must be subjected to a subsequent annealing (see column 4). Because of the need for heating the substrate and/or annealing the ferrite coating, the Machida process is not suitable for the large-scale production of ferrite coatings.

Another ferrite coating process is described in U.S. Pat. No. 4,837,046 of Massao Oishi et al. At column 1 of this Oishi patent, the disadvantages of several prior ferrite coating processes are discussed. At column 1 of the patent, Oishi teaches that these prior processes often produce a product whose magnetic recording density is low, and/or require high temperatures, and/or cannot utilize as a substrate a material having a low melting point or a low decomposition temperature or poor heat stability, and/or do not achieve a satisfactory rate of production in an industrial scale, and/or do not produce a suitably high-quality product. However, Oishi's process also suffers from several disadvantages. In the first place, it only can be used on a relatively limited range of substrates (see column 4). In the second place, because Oishi's process usually requires the rotation of the substrate at a speed of about 400 revolutions per minute (see Example 1), a inhomogeneous coating often produced with substantial differences between its center and edge. In the third place, a process such as Oishi's which requires rapid rotation of a substrate is not suitable for large scale production of coatings.

In 1990, another attempt was made to provide a commercially feasible process for producing ferritic coatings. This attempt was described in U.S. Pat. No. 4,948,626 of Yasunaga et al. The Yasunaga process, however, required the use of a vacuum chamber and, obviously, was also not suitable for the large scale production of ferritic coatings. A substantial amount of energy, time, and money is required for a vacuum system and its operation. In addition, the size of the film which can be made by the vacuum deposition processes is limited by the size of the vacuum chamber used.

It is an object of this invention to provide a process for the production of ferritic coatings which may be conducted under atmospheric conditions.

It is another object of this invention to provide a process for the production of ferritic coatings which does not require that the substrate used in the process be heated.

It is yet another object of this invention to provide a process for the production of ferritic coatings which does not require that the coating applied to the substrate material be annealed after deposition.

It is yet another object of this invention to provide a process for the production of ferritic coatings which produces a coating which is substantially homogeneous.

It is yet another object of this invention to provide a process for the production of ferritic coatings which is suitable for the large-scale production of such coatings.

It is yet another object of this invention to provide a process for the production of ferritic coatings which can be used to produce complex, coated shaped articles.

SUMMARY OF THE INVENTION

In accordance with this invention, there is provided an atmospheric process for the production of a ferritic coating or film. In the first step of this process, an aerosol mist containing reactants necessary to form the ferrite is provided. Thereafter, the mist is subjected to radio-frequency radiation while in the plasma region. Thereafter, the vaporized mixture is then deposited onto a substrate.

BRIEF DESCRIPTION OF THE DRAWING

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
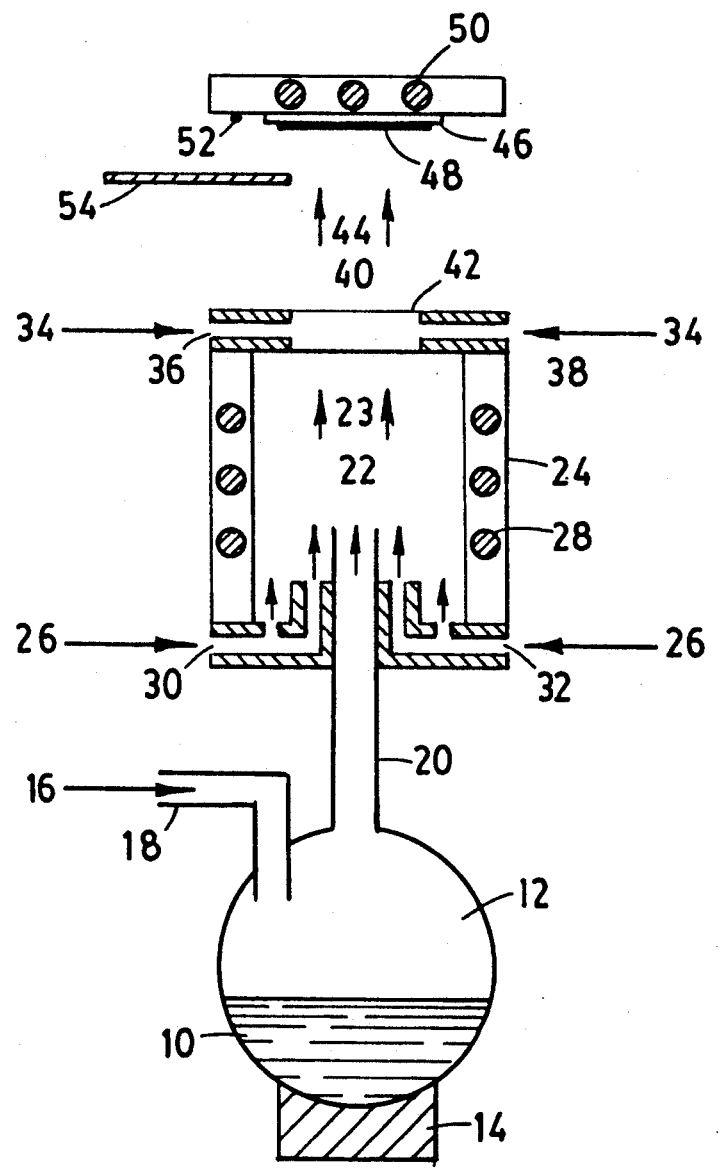
FIG. 1 is a system diagram illustrating one preferred embodiment of the process of this invention.

FIG. 1 illustrates a preferred embodiment of applicants' process. In the first step of the process, a solution 10 of reagents is charged into misting chamber 12.

The reagents charged into misting chamber 12 will be sufficient to form a ferrite in the process. As is known to those skilled in the art, a ferrite is a ferromagnetic compound containing $Fe_2O_3$. See, for example, U.S. Pat. No. 3,576,672 of Harris et al., the entire disclosure of which is hereby incorporated by reference into this specification.

In one embodiment, the ferrite is a garnet. Pure iron garnet has the formula $M_3Fe_5O_{12}$; see, e.g., pages 65–256 of Wilhelm H. Von Aulock's "Handbook of Microwave Ferrite Materials" (Academic Press, New York, 1965). Garnet ferrites are also described, e.g., in U.S. Pat. No. 4,721,547, the disclosure of which is hereby incorporated by reference into this specification.

In another embodiment, the ferrite is a spinel ferrite. Spinel ferrites usually have the formula $MFe_2O_4$, wherein M is a divalent metal ion and Fe is a trivalent iron ion. M is typically selected from the group consisting of nickel, zinc, magnesium, manganese, and like. These spinel ferrites are well known and are described, for example, in U.S. Pat. Nos. 5,001,014, 5,000,909, 4,966,625, 4,960,582, 4,957,812, 4,880,599, 4,862,117, 4,855,205, 4,680,130, 4,490,268, 3,822,210, 3,635,898, 3,542,685, 3,421,933, and the like. The disclosure of each of these patents is hereby incorporated by reference into this specification. Reference may also be had to pages 269–406 of the Aulock book for a discussion of spinel ferrites.

In yet another embodiment, the ferrite is a lithium ferrite. Lithium ferrites are often described by the formula $(Li_{0.5}Fe_{0.5})^{2+}(Fe_2)^{3+}O_4$. Some illustrative lithium ferrites are described on pages 407–434 of the aforementioned Aulock book and in U.S. Pat. Nos. 4,277,356, 4,238,342, 4,177,438, 4,155,963, 4,093,781, 4,067,922, 3,998,757, 3,767,581, 3,640,867, and the like. The disclosure of each of these patents is hereby incorporated by reference into this specification.

In yet another embodiment, the preferred ferrite is a hexagonal ferrite. These ferrites are well known and are disclosed on pages 451–518 of the Aulock book and also in U.S. Pat. Nos. 4,816,292, 4,189,521, 5,061,586, 5,055,322, 5,051,201, 5,047,290, 5,036,629, 5,034,243, 5,032,931, and the like. The disclosure of each of these patents is hereby incorporated by reference into this specification.

Referring again to FIG. 1, it will be appreciated that the solution 10 will comprise reagents necessary to form the ferrite material. For example, in one embodiment, in order to form the spinel nickel ferrite of the formula $NiFe_2O_4$, the solution must contain nickel and iron, which may be present in the form of nickel nitrate and iron nitrate. By way of further example, one may use nickel chloride and iron chloride to form the same spinel. By way of further example, one may use nickel sulfate and iron sulfate.

It will be apparent to skilled chemists that many other combinations of reagents, both stoichiometric and non-stoichiometric, may be used in applicants' process to make many different ferrites.

In one preferred embodiment, the solution 10 contains the regent needed to produce the desired ferrite in stoichiometric ratio. Thus, to make the $NiFe_2O_4$ ferrite in this embodiment, one mole of nickel nitrate may be charged with every two moles of iron nitrate.

In one embodiment, the starting materials are powders with purities exceeding 99 percent.

In one embodiment, compounds of iron and the other desired ions are present in the solution in the stoichiometric ratio.

In one preferred embodiment, ions of nickel, zinc, and iron are present in a stoichiometric ratio of 0.5/0.5/2.0, respectively. In another preferred embodiment, ions of lithium and iron are present in the ratio of 0.5/2.5. In yet another preferred embodiment, ions of magnesium and iron are present in the ratio of 1.0/2.0. In another embodiment, ions of manganese and iron are present in the ratio 1.0/2.0. In yet another embodiment, ions of yttrium and iron are present in the ratio of 3.0/5.0. In yet another embodiment, ions of lanthanum, yttrium, and iron are present in the ratio of 0.5/2.5/5.0. In yet another embodiment, ions of neodymium, yttrium, gadolinium, and iron are present in the ratio of 1.0/1.07/0.93/5.0, or 1.0/1.1/0.9/5.0, or 1/1.12/0.88/5.0. In yet another embodiment, ions of samarium and iron are present in the ratio of 3.0/5.0. In yet another embodiment, ions of neodymium, samarium, and iron are present in the ratio of 0.1/2.9/5.0, or 0.25/2.75/5.0, or 0.375/2.625/5.0. In yet another embodiment, ions of neodymium, erbium, and iron are present in the ratio of 1.5/1.5/5.0. In yet another embodiment, samarium, yttrium, and iron ions are present in the ratio of 0.51/2.49/5.0, or 0.84/2.16/5.0, or 1.5/1.5/5.0. In yet another embodiment, ions of yttrium, gadolinium, and iron are present in the ratio of 2.25/0.75/5.0, or 1.5/1.5/5.0, or 0.75/2.25/5.0. In yet another embodiment, ions of terbium, yttrium, and iron are present in the ratio of 0.8/2.2/5.0, or 1.0/2.0/5.0. In yet another embodiment, ions of dysprosium, aluminum, and iron are present in the ratio of $3/X/5-X$, when X is from 0 to 1.0. In yet another embodiment, ions of dysprosium, gallium, and iron are also present in the ratio of $3/X/5-X$. In yet another embodiment, ions of dysprosium, chromium, and iron are also present in the ratio of $3/X/5-X$.

The ions present in the solution may be holmium, yttrium, and iron, present in the ratio of $z/3-z/5.0$, where z is from about 0 to 1.5.

The ions present in the solution may be erbium, gadolinium, and iron in the ratio of 1.5/1.5/5.0. The ions may be erbium, yttrium, and iron in the ratio of 1.5/1.5/1.5, or 0.5/2.5/5.0.

The ions present in the solution may be thulium, yttrium, and iron, in the ratio of 0.06/2.94/5.0.

The ions present in the solution may be ytterbium, yttrium, and iron, in the ratio of 0.06/2.94/5.0.

The ions present in the solution may be lutetium, yttrium, and iron in the ratio of y/3-y/5.0, wherein y is from 0 to 3.0.

The ions present in the solution may be iron, which can be used to form $Fe_6O_8$ (two formula units of $Fe_3O_4$). The ions present may be barium and iron in the ratio of 1.0/6.0, or 2.0/8.0. The ions present may be strontium and iron, in the ratio of 1.0/12.0. The ions present may be strontium, chromium, and iron in the ratio of 1.0/1.0/10.0, or 1.0/6.0/6.0. The ions present may be suitable for producing a ferrite of the formula $(Me_x)^{3+}Ba_{1-x}Fe_{12}O_{19}$, wherein Me is a rare earth selected from the group consisting of lanthanum, promethium, neodymium, samarium, europium, and mixtures thereof.

The ions present in the solution may contain barium, either lanthanum or prometheum, iron, and cobalt in the ratio of 1-a/a/12-a/a, wherein a is from 0.0 to 0.8.

The ions present in the solution may contain barium, cobalt, titanium, and iron in the ratio of 1.0/b/b/12-2b, wherein b is from 0.0 to 1.6.

The ions present in the solution may contain barium, nickel or cobalt or zinc, titanium, and iron in the ratio of 1.0/c/c/12-2c, wherein c is from 0.0 to 1.5.

The ions present in the solution may contain barium, iron, iridium, and zinc in the ratio of 1.0/12-2d/d/d, wherein d is from 0.0 to 0.6.

The ions present in the solution may contain barium, nickel, gallium, and iron in the ratio of 1.0/2.0/7.0/9.0, or 1.0/2.0/5.0/11.0. Alternatively, the ions may contain barium, zinc, gallium or aluminum, and iron in the ratio of 1.0/2.0/3.0/13.0.

Each of these ferrites is well known to those in the ferrite art and is described, e.g., in the aforementioned Aulock book.

The ions described above are preferably available in solution 10 in water-soluble form, such as, e.g., in the form of water-soluble salts. Thus, e.g., one may use the nitrates or the chlorides or the sulfates or the phosphates of the cations. Other anions which form soluble salts with the cation(s) also may be used.

Alternatively, one may use salts soluble in solvents other than water. Some of these other solvents which may be used to prepare the material include nitric acid, hydrochloric acid, phosphoric acid, sulfuric acid, and the like. As is well known to those skilled in the art, many other suitable solvents may be used; see, e.g., J. A. Riddick et al., "Organic Solvents, Techniques of Chemistry," Volume II, 3rd edition (Wiley-Interscience, New York, N.Y., 1970), the disclosure of which is hereby incorporated by reference into this specification.

In one preferred embodiment, where a solvent other than water is used, each of the cations is present in the form of one or more its oxides. For example, one may dissolve iron oxide in nitric acid, thereby forming a nitrate. For example, one may dissolve zinc oxide in sulfuric acid, thereby forming a sulfate. One may dissolve nickel oxide in hydrochloric acid, thereby forming a chloride. Other means of providing the desired cation(s) will be readily apparent to those skilled in the art.

In general, as long as the desired cation(s) are present in the solution, it does not matter that much how it was obtained.

In general, one may use commercially available reagent grade materials. Thus, by way of illustration and not limitation, one may use the following reagents available in the 1988-1989 Aldrich catalog (Aldrich Chemical Company, Inc., Milwaukee, Wis.): barium chloride, catalog number 31,866-3; barium nitrate, catalog number 32,806-5; barium sulfate, catalog number 20,276-2; strontium chloride hexhydrate, catalog number 20,466-3; strontium nitrate, catalog number 20,449-8; yttrium chloride, catalog number 29,826-3; yttrium nitrate tetrahydrate, catalog number 21,723-9; yttrium sulfate octahydrate, catalog number 20,493-5. This list is merely illustrative, and other compounds which can be used will be readily apparent to those skilled in the art. Thus, any of the desired reagents also may be obtained from the 1989-1990 AESAR catalog (Johnson Matthey/AESAR Group, Seabrook, N.H.), the 1990/1991 Alfa catalog (Johnson Matthey/Alfa Products, Ward Hill, Ma.), the Fisher 88 catalog (Fisher Scientific, Pittsburgh, Pa.), and the like.

As long as the metals present in the desired ferrite material are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

In one preferred embodiment, aqueous solutions of nickel nitrate, and iron nitrate with purities of at least 99.9 percent are mixed in the molar ratio of 1:2 and then dissolved in distilled water to form a solution with a concentration of 150 grams per liter.

In one preferred embodiment, aqueous solutions of nickel nitrate, zinc nitrate, and iron nitrate with purities of at least 99.9 percent are mixed in the molar ratio of 0.5:0.5:2 and then dissolved in distilled water to form a solution with a concentration of 150 grams per liter.

In one preferred embodiment, aqueous solutions of zinc nitrate, and iron nitrate with purities of at least 99.9 percent are mixed in the molar ratio of 1:2 and then dissolved in distilled water to form a solution with a concentration of 150 grams per liter.

In one preferred embodiment, aqueous solutions of nickel chloride, and iron chloride with purities of at least 99.9 percent are mixed in the molar ratio of 1:2 and then dissolved in distilled water to form a solution with a concentration of 150 grams per liter.

In one preferred embodiment, aqueous solutions of nickel chloride, zinc chloride, and iron chloride with purities of at least 99.9 percent are mixed in the molar ratio of 0.5:0.5:2 and then dissolved in distilled water to form a solution with a concentration of 150 grams per liter.

In one preferred embodiment, aqueous solutions of zinc chloride, and iron chloride with purities of at least 99.9 percent are mixed in the molar ratio of 1:2 and then dissolved in distilled water to form a solution with a concentration of 150 grams per liter.

In one embodiment, mixtures of chlorides and nitrides may be used. Thus, for example, in one preferred embodiment, the solution is comprised of both iron chloride and nickel nitrate in the molar ratio of 2.0/1.0.

Referring again to FIG. 1, the solution 10 in misting chamber 12 is preferably caused to form into an aerosol, such as a mist.

The term aerosol, as used in this specification, refers to a suspension of ultramicroscopic solid or liquid particles in air or gas, such as smoke, fog, or mist. See, e.g., page 15 of "A dictionary of mining, mineral, and related terms," edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer, publication A-850-C (published by DeVilbiss, Somerset, Pa., 1989), the disclosure of which is hereby incorporated by reference into this specification.

In the embodiment shown in FIG. 1, the oscillators of ultrasonic nebulizer 14 are shown contacting an exterior surface of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et al., "Plasma Deposited Thin Films" (CRC Press Inc., Boca Raton, Fla., 1986); "Methods of Experimental Physics," Volume 9—Parts A and B, Plasma Physics (Academic Press, New York, 1970/1971); N. H. Burlin-game, "Glow Discharge Nitriding of Oxides," Ph.D. thesis (Alfred University, Alfred, N.Y., 1985), available from University Microfilm International, Ann Arbor, Mich. Each of these publications is hereby incorporated by reference into this specification.

In one preferred embodiment, the plasma reactor 24 was "model 56 torch" available from the TAFA Inc. of Concord, N.H. It was operated at a frequency of about 4 megahertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, New York, 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor at a flow rate of from about 5 to about 30 liters per minute.

When a mixture of oxgyen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the ferrite material.

Radio frequency energy is applied to the reagents in the plasma reactor 24, and it causes vaporization of the mist.

In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which manufactured by Lepel Company (a division of TAFA Inc.) and which generates an alternating current with a frequency of 4 megaherz at a power input of 30 kilowatts. Thus, e.g., one may use an induction coil driven at 2.5–5.0 megahertz which is sold as the "PLASMOC 2" by ENI Power Systems, Inc. of Rochester, N.Y.

The use of these type of radio-frequency generators is described in the Ph.D. theses entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et seq. of said McPherson thesis.

The vapor 44 present in flame region 40 is propelled upward towards substrate 46. Any material onto which vapor 44 will condense may be used as a substrate. Thus, by way of illustration, one may use nonmagnetic materials such alumina, glass, gold-plated ceramic materials, and the like. In one preferred embodiment, substrate 46 consists essentially of a magnesium oxide material such as single crystal magnesium oxide, polycrystalline magnesium oxide, and the like.

In another embodiment, the substrate 46 consists essentially of zirconia such as, e.g., yttrium stabilized cubic zirconia.

In another embodiment, the substrate 46 consists essentially of a material selected from the group consisting of strontium titanate, stainless steel, alumina, sapphire, and the like.

The aforementioned listing of substrates is merely meant to be illustrative, and it will be apparent that many other substrates may be used. Thus, by way of illustration, one may use any of the substrates mentioned in M. Sayer's "Ceramic Thin Films . . . " article, supra. Thus, for example, it is preferred to use one or more of the substrates described on page 286 of "Superconducting Devices," edited by S. T. Ruggiero et al. (Academic Press, Inc., Boston, 1990), the disclosure of which is hereby incorporated by reference into this specification.

One advantage of applicants' process is that the substrate may be of substantially any size or shape, and it may be stationary or movable. Because of the speed of the coating process, the substrate 46 may be moved across the aperture 42 and have any or all of its surface be coated with the film 48.

The substrate may be at ambient temperature. Alternatively, one may use additional heating means to heat the substrate prior to, during, or after deposition of the coating.

In one preferred embodiment, heater 50 is used to heat the substrate to a temperature of from about 100 to about 800 degrees centigrade.

Temperature sensing means 52 may be used to sense the temperature of the substrate and, by feedback means (not shown) adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to substrate 46. The use of this shutter 54 is important prior to the time the flame region has become stable; and the vapor should not be allowed to impinge upon the substrate prior to such time.

The substrate 46 may be moved in a plane which is substantially parallel to the top of plasma chamber 24. Alternatively, or additionally, it may be moved in a plane which is substantially perpendicular to the top of plasma chamber 24. In one embodiment, the substrate 46 is moved stepwise along a predetermined path to coat the substrate only at certain predetermined areas.

In one embodiment, rotary substrate motion is utilized to expose as much of the surface of a complex-shaped article to the coating. This rotary substrate motion may be effected by conventional means. See, e.g., "Physical Vapor Deposition," edited by Russel J. Hill (Temescal Division of The BOC Group, Inc., Berkeley, Calif., 1986), the disclosure of which is hereby incorporated by reference into this specification.

The process of this invention allows one to coat an article at a deposition rate of from about 0.01 to about 10 microns per minute and, preferably, from about 0.1 to about 1.0 microns per minute, with a substrate with an exposed surface of 35 square centimeters. One may determine the thickness of the film coated upon said reference substrate material (with an exposed surface of 35 square centimeters) by means well known to those skilled in the art.

The film thickness can be monitored in situ, while the vapor is being deposited onto the substrate. Thus, by way of illustration, one may use an IC-6000 thin film thickness monitor (as referred to as "deposition controller") manufactured by Leybold Inficon Inc. of East Syracuse, N.Y.

The deposit formed on the substrate may be measured after the deposition by standard profilemetry techniques. Thus, e.g., one may use a DEKTAK Surface Profiler, model number 900051 (available from Sloan Technology Corporation, Santa Barbara, Calif.)

In general, the process of this invention may be used to deposit films which are from about 0.1 to about 500 microns and, preferably, from about 1 to about 100 microns. In a more preferred embodiment, the films deposited by the process are from about 10 to about 50 microns in thickness.

The "as-deposited" film produced by the process of this invention consists of uniform, small grains. The term "as-deposited" refers to the film prior to the time it is subjected to post-annealing.

In general, at least about 80 volume percent of the particles in the as-deposited film are smaller than about 1 microns. It is preferred that at least about 90 percent of such particles are smaller than 1 micron. Because of this fine grain size, the surface of the film is relatively smooth.

In one preferred embodiment, the as-deposited film is post-annealed.

It is preferred that the generation of the vapor in plasma rector 24 be conducted under substantially atmospheric pressure conditions. As used in this specification, the term "substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms," supra.

The process of this invention may be used to produce coatings on a flexible substrate such as, e.g., stainless steel strips, silver strips, gold strips, copper strips, aluminum strips, and the like. One may deposit the coating directly onto such a strip. Alternatively, one may first deposit one or more buffer layers onto the strip(s).

The deposition of buffer layers between a substrate and a coating is well known to those skilled in the art. See, e.g., (1)H. S. Kwok et al., "Laser evaporation deposition of superconducting and dielectric thin films," Applied Physics Letters, Volume 52 (21), May 23, 1988; (2)S. Witanachchi et al., "Laser Deposition of Superconducting and Semiconducting Thin Films," in "Superconductivity and its Applications," edited by H. S. Kwok et al. (Elsevier Company, New York, 1988), at pages 194 et seq. The disclosure of each of these publications is hereby incorporated by reference into this specification.

The following examples are presented to illustrate the claimed invention but are not to be deemed limitative thereof. Unless otherwise specified, all parts are by weight and all temperatures are in degrees centigrade.

EXAMPLE 1

57.76 grams of $FeCl_2.4H_2O$ (lot number 743183, Fisher Scientific Co., Fairlawn, N.J. 07410), and 42.24 grams of $Ni(NO_3)_2.6H_2O$ (lot number 9490, J. T. Baker Chemical Co., Phillipsburg, N.J.) were mixed with 1 liter of distilled water to form an aqueous solution. The solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 watts and a frequency of 1.63 megahertz; the misting droplets formed were from about 0.5 to about 5.0 microns diameter in size. The gas inlet of the chamber was connected to a source of argon flowing at a rate of approximately 100 milliliters per minute.

The output from the misting chamber was connected to the TAFA plasma reactor equipped with the Lepel radio frequency requency generator, both of which are described in the specification. The Lepel radio frequency generator was operated at a power of 30 kilowatts and produced an alternating current of 4 megahertz. A mixture of oxygen and argon was introduced into the bottom portion of the plasma reactor; the oxygen flow rate was 30 liters per minute, and the argon flow rate was 30 liters per minute.

The distance between the top of the plasma reactor and the substrate was 10 centimeters.

The vapor from the plasma reactor deposited onto a glass slide substrate which was 2.0 centimeter by 10.0 centimeter by 0.5 centimeters. A coated object with a film thickness of approximately 1 microns was obtained. X-ray diffraction analysis indicated the presence of a nickel-iron oxide composition identified as "trevorite, synthetic" and was consistent with a composition of the formula $NiFe_2O_4$. Energy Dispersive X-ray analysis indicated the presence of both nickel and iron in the composition.

EXAMPLE 2

The procedure of Example 1 was substantially repeated, with the exception that the solution contained 57.48 grams of $FeCl_2.4H_2O$, 21.02 grams of $Ni(NO_3)_2.6H_2O$, and 21.5 grams of $Zn(NO_3)_2.6H_2O$ (lot number 763151, Fisher Scientific Company, Fairlawn, N.J.).

The ferritic coatings were deposited onto three different substrates. One of such substrates was a glass slide. Another of such substrates was an alumina wafer. Yet another of these substrates was a gold-coated zirconium titanate substrate.

The film deposited on each of these substrates was subjected to X-ray diffraction analysis which, in each case, indicated the presence of $Ni_{0.5}Zn_{0.5}Fe_2O_4$. Energy Dispersive X-Ray analysis confirmed the presence of the nickel, zinc, and iron metals.

EXAMPLE 3

In substantial accordance with the procedure described in Example 1, a solution comprised of 1.4827 grams of $Ni(NO_3)_2.6H_2O$, 1.2485 grams of $Zn(NO_3)_2.6H_2O$, 7.2589 grams of $Fe(NO_3)_3.9H_2O$ (lot number 712262, Fisher Scientific Company) were dissolved in 100 milliliters of distilled water.

The substrate used in this example was a glass slide. X-ray diffraction analysis showed the presence of $Ni_{0.5}Zn_{0.5}Fe_2O_4$.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

Thus, by way of illustration, in one embodiment the relative position of the substrate and the plasma reactor may be reversed. In the preferred embodiment illustrated in FIG. 1, the substrate is disposed above the plasma reactor. In another embodiment, not shown, the substrate may be disposed below the plasma reactor and the coating material may flow downwardly.

Thus, by way of further illustration, and referring to FIG. 1, plasma reactor 24 may be tilted, reversed, or otherwise differently disposed than shown in said Figure without adversely affecting applicants' process.

We claim:

1. A process for coating a layer of ferritic material with a thickness of from about 0.1 to about 500 microns onto a substrate at a deposition rate of from about 0.01 to about 10 microns per minute per 35 square centimeters of substrate surface, comprising the steps of:

(a) providing a solution comprised of a first compound and a second compound, wherein said first compound is an iron compound and said second compound is selected from the group consisting of compounds of nickel, zinc, magnesium, strontium, barium, manganese, lithium, lanthanum, yttrium, scandium, samarium, europium, terbium, dysprosium, holmium, erbium, ytterbium, lutetium, cerium, praseodymium, thulium, neodymium, gadolinium, aluminum, iridium, lead, chromium, gallium, indium, chromium, promethium, cobalt, titanium, and mixtures thereof, and wherein said solution is comprised of from about 0.01 to about 1,000 grams of a mixture consisting essentially of said compounds per liter of said solution;

(b) subjecting said solution to ultrasonic sound waves at a frequency in excess of 20,000 hertz, and to an atmospheric pressure of at least about 600 millimeters of mercury, thereby causing said solution to form into an aerosol;

(c) providing a radio frequency plasma reactor comprised of a top section, a bottom section, and a radio-frequency coil;

(d) generating a hot plasma gas within said radio frequency plasma reactor, thereby producing a plasma region;

(e) providing a flame region disposed above said top section of said radio frequency plasma reactor;

(f) contacting said aerosol with said hot plasma gas within said plasma reactor while subjecting said aerosol to an atmospheric pressure of at least about 600 millimeters of mercury and to a radio frequency alternating current at a frequency of from about 100 kilohertz to about 30 megahertz, thereby forming a vapor;

(g) providing a substrate disposed above said flame region; and (h) contacting said vapor with said substrate, thereby forming said layer of ferritic material.

2. The process as recited in claim 1, wherein said deposition rate is from about 0.01 to about 1.0 microns per minute per 35 square centimeters of substrate surface.

3. The process as recited in claim 2, wherein said aerosol is subjected while within said plasma reactor to a radio frequency alternating current of from about 1 to about 20 megahertz.

4. The process as recited in claim 3, wherein said solution is subjected to ultrasonic sound waves at a frequency in excess of one megahertz.

5. The process as recited in claim 4, wherein said solution is comprised of from about 1 to about 300 grams of said mixture consisting essentially of said first compound and said second compound, per liter of said solution.

6. The process as recited in claim 5, wherein said aerosol, while in said plasma reactor, is subjected to a pressure of from about 600 to about 1,000 millimeters of mercury.

7. The process as recited in claim 6, wherein said layer of ferrite material has a thickness of from about 0.1 to about 100 microns.

8. The process as recited in claim 7, wherein said second compound is nickel.

9. The process as recited in claim 7, wherein said second compound is zinc.

10. The process as recited in claim 7, wherein said second compound is nickel and zinc.

11. The process as recited in claim 10 wherein said nickel and said zinc are present in said solution in a molar ratio of about 1:1.

12. The process as recited in claim 8, wherein said iron compound and said nickel compound are present in said solution in a molar ratio of about 0.5:1.0.

13. The process as recited in claim 9, wherein said iron compound and said zinc compound are present in said solution in a molar ratio of about 0.5:1.0.

14. The process as recited in claim 7, wherein said deposition rate is from about 0.1 to about 1.0 microns per minute per 35 square centimeters of substrate surface.

15. The process as recited in claim 14, wherein said aerosol is subjected while within said plasma reactor to a radio frequency alternating current of from about 1 to about 20 megahertz.

16. The process as recited in claim 15, wherein said solution is subjected to said ultrasonic sound waves at a frequency in excess of one megahertz.

17. The process as recited in claim 16, wherein said layer of ferritic material has a thickness of from about 1 to about 100 microns.

* * * * *